United States Patent
Reina et al.

(10) Patent No.: US 12,051,458 B2
(45) Date of Patent: Jul. 30, 2024

(54) TECHNIQUES TO REFRESH MEMORY SYSTEMS OPERATING IN LOW POWER STATES BASED ON TEMPERATURE

(71) Applicant: Micron Technology, Inc., Boise, ID (US)

(72) Inventors: Vincenzo Reina, Munich (DE); Christopher Joseph Bueb, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 17/713,641

(22) Filed: Apr. 5, 2022

(65) Prior Publication Data

US 2023/0317135 A1 Oct. 5, 2023

(51) Int. Cl.
*G11C 11/406* (2006.01)
*G11C 5/14* (2006.01)
*G11C 11/4074* (2006.01)
*G11C 11/4076* (2006.01)

(52) U.S. Cl.
CPC ........ *G11C 11/40615* (2013.01); *G11C 5/148* (2013.01); *G11C 11/40622* (2013.01); *G11C 11/4074* (2013.01); *G11C 11/4076* (2013.01)

(58) Field of Classification Search
CPC .............. G11C 11/40615; G11C 5/148; G11C 11/40622; G11C 11/4074; G11C 11/4076; G11C 7/04; G11C 2207/2227; G11C 2211/4067; G11C 11/40626
See application file for complete search history.

(56) References Cited

U.S. PATENT DOCUMENTS

| | | | |
|---|---|---|---|
| 9,640,242 B1 * | 5/2017 | Lo .................. | G11C 11/4074 |
| 2009/0154279 A1 * | 6/2009 | Hong .................. | G01K 7/00 374/170 |
| 2017/0117033 A1 * | 4/2017 | Doo .................. | G11C 11/40626 |
| 2018/0061483 A1 * | 3/2018 | Morgan ............ | G11C 11/40626 |
| 2019/0311763 A1 * | 10/2019 | Jin .................... | G11C 11/40626 |

* cited by examiner

*Primary Examiner* — Donald H B Braswell
(74) *Attorney, Agent, or Firm* — Holland & Hart LLP

(57) ABSTRACT

Methods, systems, and devices for techniques to refresh memory systems operating in low power states are described. The memory system may operate in a first power mode that includes deactivation of a voltage rail that supplies power to the memory system. The memory system may receive the power over the voltage rail during a time period that the memory system is operating in the first power mode. In some cases, the memory system may determine that the power may be received for a duration and a command is not received during that duration. The memory system may perform a self-refresh operation based on determining that the duration indicated by the timer expires without receiving a command.

22 Claims, 5 Drawing Sheets

TECHNIQUES TO REFRESH MEMORY SYSTEMS OPERATING IN LOW POWER STATES BASED ON TEMPERATURE

FIELD OF TECHNOLOGY

The following relates to one or more systems for memory, including techniques to refresh memory systems operating in low power states.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
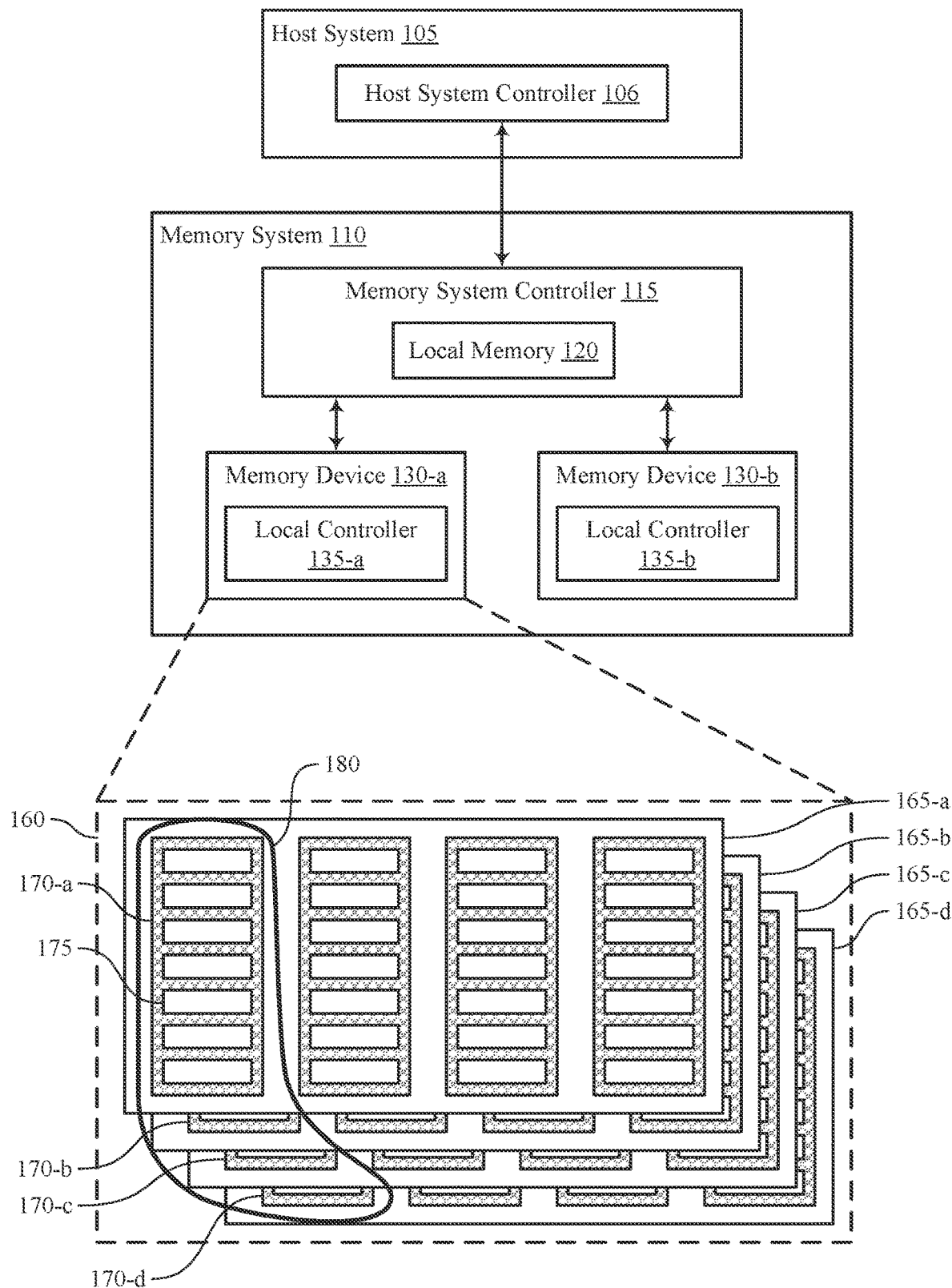
FIG. 1 illustrates an example of a system that supports techniques to refresh memory systems operating in low power states in accordance with examples as disclosed herein.

A system may include a memory system and a host system coupled with the memory system. Some applications, such as vehicle safety systems, autonomous vehicle systems, or other safety systems, may employ a mode where if a vehicle system is turned off, the memory device associated with the vehicle system may be placed in a low power state. In some cases, the memory device may be exploited by unauthorized actors when the system is turned off. For example, the memory device may experience problems (e.g., errors occurred in stored data) after long periods of storage, temperature differences and/or if the system is powered off for extended periods of time. In some examples, an unauthorized user may use commands to cause the memory system to modify the data stored by the memory system.

Resuming operations with modified data may increase the risk of hacking and other comprises to the system as a whole, which may have a variety of consequences including theft of information from the system, failure of various sub-systems of the system, ransomware attacks, increasing the power consumption, decreasing the efficiency and start-up time of performing operations, and decreasing the overall performance of the memory system. Such cases may pose a threat to the security and safety of system associated with the memory device. In some systems, the memory system may be moved into a higher power state to perform a self-refresh operation. For example, the host system may be configured to periodically power on the memory system (e.g., transition the memory system from a low power mode, such as a sleep mode or a powered off mode, to the high power mode), such that the memory system may periodically perform the refresh operations. However, periodically entering a higher power mode may consume power or other system resources. Accordingly, techniques to reduce power consumption associated with refreshing memory cells of a memory system are desired. The self-refresh operation may use internal logic that initiates refresh operations to address the features exploited and/or errors. Additionally, in some systems, the self-refresh operations may be initiated by the host system.

Systems, devices, and techniques are described to improve security and safety of the memory system by performing a memory system initiated self-refresh operation while in a lower power mode (e.g., low power state). The memory system may trigger an energy saving refresh algorithm without powering on the entire memory system. In some cases, the memory system may operate in a first power mode that includes deactivation of a voltage rail that supplies power to the memory system. The memory system may receive the power over the voltage rail during a time period that the memory system is operating in the first power mode. For example, a Universal Flash Storage (UFS) of the memory system may be powered off, but then the memory system may power on the UFS. In such cases, a power management component of the memory system may apply power to a voltage rail of the memory system. Such an application of power may be a precursor to receiving a command from the host system. For example, the UFS may initialize itself without interaction with the host system, including potentially performing a periodic refresh (e.g., self-refresh operation) without host interaction. In some examples, the memory system may activate a timer after receiving the power over the voltage rail. If no command is received before the timer expires, the memory system may initiate the self-refresh operation based on determining that a duration indicated by the time expires.

In such cases, performing a self-refresh operation while in a lower power mode and without host interaction may reduce command latency and allow for fast and efficient procedures (e.g., decreased processing complexity and improved processing times). For example, the memory system may experience reduced power consumption and increased coordination with less signaling overhead. In some cases, the reliability of the memory system including the memory device may be increased, thereby allowing the memory device or other components to perform operations at improved speeds, efficiency, and performance.

Features of the disclosure are initially described in the context of a system with reference to FIG. 1. Features of the disclosure are described in the context of a flow diagram and a timing diagram with reference to FIGS. 2-3. These and other features of the disclosure are further illustrated by and described in the context of an apparatus diagram and flowchart that relate to techniques to refresh memory systems operating in low power states with reference to FIGS. 4-5.

FIG. 1 illustrates an example of a system 100 that supports techniques to refresh memory systems operating in low power states in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-$a$ and 130-$b$ are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support techniques to refresh memory systems operating in low power states. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some cases, the memory system 110 may operate in a first power mode that includes deactivation of a voltage rail that supplies power to the memory system 110. For example, the memory system 110 may operate in a lower power mode. The memory system 110 may receive the power over the voltage rail during a time period that the memory system 110 is operating in the first power mode. For example, the memory system 110 may initialize a portion of the memory system 110. In some cases, the memory system 110 may determine that a duration indicated by a timer expires in response to receiving the power over the voltage rail. The memory system 110 may perform a self-refresh operation in direct response to determining that the duration indicated by the timer expires.

Figure 2:
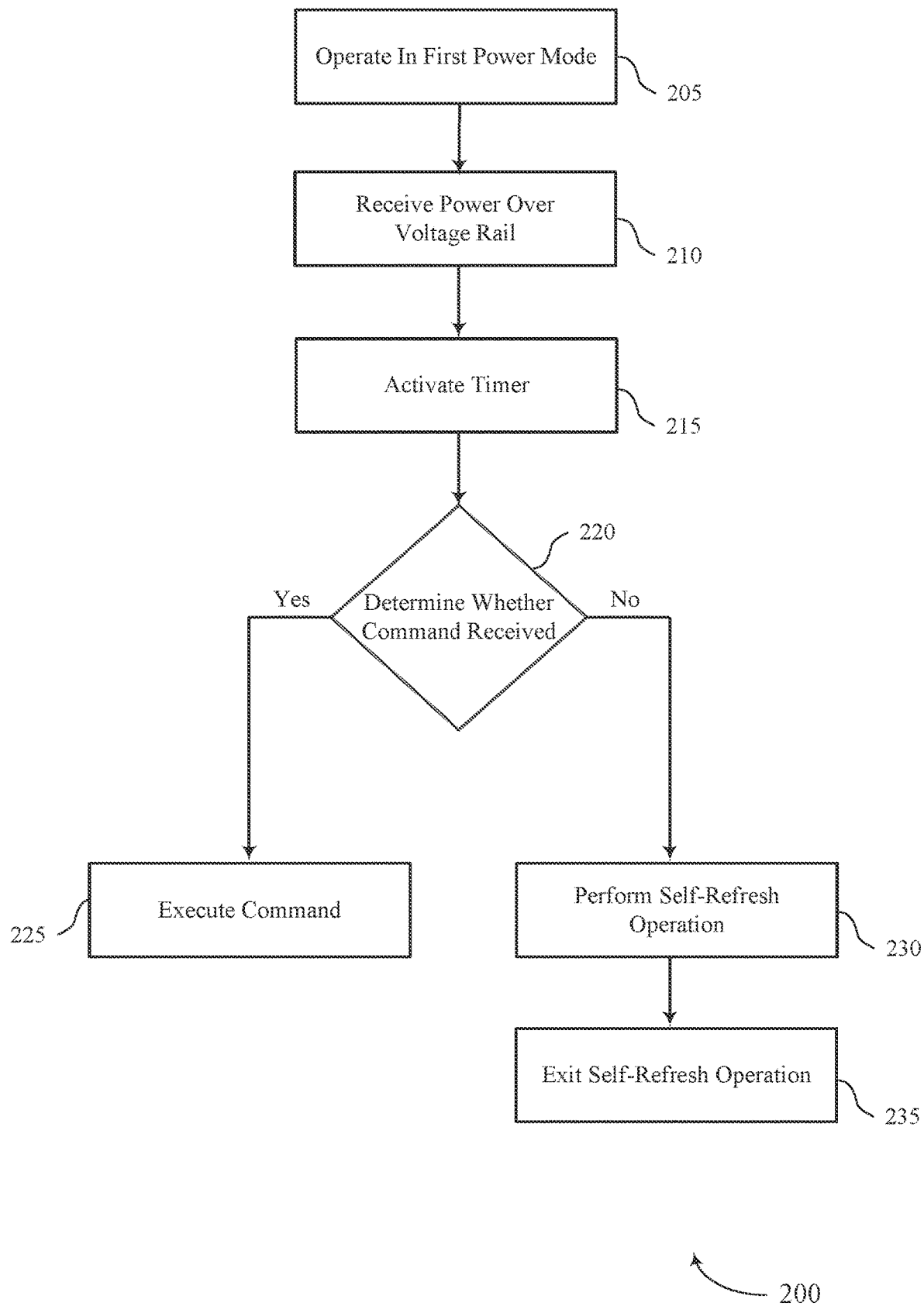
FIG. 2 illustrates an example of a flow diagram that supports techniques to refresh memory systems operating in low power states in accordance with examples as disclosed herein.

FIG. 2 illustrates an example of a flow diagram 200 that supports techniques to refresh memory systems operating in low power states in accordance with examples as disclosed herein. The flow diagram 200 may include a host system and a memory system. The host system and the memory system may be examples of the corresponding devices described with respect to FIG. 1. Alternative examples of the following may be implemented, where some steps are performed in a different order than described or not performed at all. In some cases, steps may include additional features not mentioned below, or further steps may be added.

Aspects of the flow diagram 200 may be implemented by a controller, among other components. Additionally or alternatively, aspects of the flow diagram 200 may be implemented as instructions stored in memory (e.g., firmware stored in a memory coupled with controller). For example, the instructions, when executed by a controller, may cause the controller to perform the operations of the flow diagram 200.

In some systems, non-volatile memory may experience problems (e.g., errors that occur in stored data) after long periods of storage, temperature differences, and/or if the system is powered off for extended periods of time. For example, when a vehicle system is turned off (e.g., not activated) for extended periods of time, the system may experience errors that result in decreased processing times and the like. If the system is stored in a high temperature environment for extended periods of time, the system may be subject to data loss unless periodically refreshed. In some systems, in order to perform a refresh operation, the host system may move the memory system from the lower power state to a higher power state and send a refresh command. Host initiated refresh operations may result in increasing the signaling overhead, increasing the power consumption, and decreasing the overall performance of the memory system.

Techniques are described for performing a memory system initiated self-refresh operation while in a lower power mode. A power management component of the system may apply power to a voltage rail of the memory system. Such an application of power may be a precursor to receiving a command from the host system. The memory system may activate a timer after receiving the power. If no command is received before the timer expires, the memory system may perform a self-refresh operation. In such cases, the memory system may initialize itself without interaction with host system, which may facilitate power savings and increased coordination with less overhead.

At 205, a first power mode may be operated. For example, the memory system may operate in a first power mode that includes deactivation of a voltage rail that supplies power to the memory system. In some cases, the memory system may receive, from the host system, a command to enter the first power mode having a lower power consumption than a second power mode. The first power mode may be an example of a lower power mode (e.g., low power state). The host system may initiate the first power mode for the memory system to operate in. The first power may include aspects of lower power consumption, as compared with an operation state (e.g., second power mode) of the memory system. In response to receiving the command, the memory system may enter the first power mode.

The first power mode may be an example of a power off mode, a sleep mode, an idle mode, a power down mode, a low power mode, a hibernate mode, or a combination thereof. In some cases, the first power mode may be associated with deactivating one or more components (e.g., voltage rails) associated with the memory system. In such cases, the first power mode may consume less energy of the memory system than the second power mode. The second power mode may be an example of a power on mode, an active mode, an awake mode, a high power mode, or a combination thereof.

During the first power mode, the memory device may conserve power, and retain data. When the memory device exits the first power mode, the memory device may experience improved start-up times for components of the vehicle safety systems, autonomous vehicle systems, or other safety systems (e.g., a back-up camera, computer, etc.), thereby increasing the efficiency and overall performance of the system due to the memory system being in the first power mode when the memory system is shut down.

At 210, power over a voltage rail may be received. For example, the memory system may receive the power over the voltage rail during a time period that the memory system is operating in the first power mode. In such cases, the memory system may initialize (e.g., turn on) a portion of the memory system without initializing the entire portion of the memory system. For example, a second voltage rail of the memory system may remain deactivated in response to receiving the power over the voltage rail. In some examples, the initialized portion of the memory system may exit the first power mode and enter a second power mode in response to receiving the power over the voltage rail. The second power mode may include aspects of higher power consumption, as compared with the first power mode.

The voltage rail may be associated with the memory system and a voltage source such that the memory system is supplied with power over the voltage rail. The memory system may include one or more voltage rails. For example, the memory system may include a first voltage rail coupled with a first portion of the memory system and a second voltage rail coupled with the second portion of the memory system. In such cases, the power may be received over the first voltage rail such that the first portion of the memory system may be initialized (e.g., turned on). The second portion of the memory system may be turned off based on the second voltage rail being deactivated (e.g., failing to supply power to the second portion of the memory system). In such cases, the same memory system may have some portions turned on while other portions may be turned off.

At 215, a timer may be activated. For example, the system may activate the timer associated with the memory system for performing the self-refresh operation in response to receiving the power over the voltage rail. In some cases, the memory system may determine that a duration indicated by the timer expires in response to receiving the power of the voltage rail. In such cases, determining that the duration indicated by the timer expires is based on activating the timer. In some examples, the timer may be started (e.g., activated) in direct response to initializing the portion of the memory system. The timer may be associated with the memory system. In some cases, the timer may be an example of a counter such that the timer starts and counts a duration of time preconfigured for the memory system.

At 220, a determination may be made whether the memory system received a command. For example, the memory system may determine that the memory system received a command over the duration in response to determining that the duration indicated by the timer expires. In such cases, the memory system may receive a command before the duration of the time expires. In response to determining that the memory system receives a command during the duration indicated by the timer, the memory system may execute the command.

At 220, a determination may be made whether a temperature of the memory system satisfies a threshold based on determining that the duration indicated by the timer expires. For example, the memory system may determine that the temperature of the memory system fails to satisfy the threshold in response to determining that the duration indicated by the timer expires. In such cases, the memory system may determine that the temperature of the memory system is below the threshold. In response to determining that the temperature of the memory system fails to satisfy the threshold, the memory system may execute the command.

At 225, the command may be executed. For example, the memory system may execute the command in direct response to receiving the command. In such cases, the memory system may execute the command in response to determining that the memory system received the command over the duration. In some examples, the memory system may execute the command in response to determining that the temperature of the memory system fails to satisfies the threshold.

At 220, the memory system may determine that the memory system has failed to receive a command over the duration in response to determining that the duration indicated by the timer expires. In such cases, the memory system failed to receive a command before the duration of the timer expired. In response to determining that the memory system did not receive a command during the duration indicated by the timer, the memory system may perform the self-refresh operation.

In some examples, the memory system may determine that the temperature of the memory system satisfies the threshold in response to determining that the duration indicated by the timer expires. For example, the memory system may determine the duration indicated by the timer expires and then check the temperature of the memory system. The memory system may periodically check the temperature of the memory system. In response to determining that the temperature of the memory system satisfies (e.g., exceeds) the threshold, the memory system may perform the self-refresh operation. The memory system may be configured to refrain from performing self-refresh operations when the memory system is at an extreme temperature (e.g., too hot or too cold). Refreshing memory cells at extreme temperatures may increase a likelihood of errors in the data, in some cases.

At 230, the self-refresh operation may be performed. For example, the memory system may perform the self-refresh operation in response to determining that the duration indicated by the timer expires. To conserve power by reducing signaling between the host system and the memory system, the memory system may use the self-refresh operation where internal logic initiates refresh operations without host interaction. In such cases, the self-refresh operation may be performed without host interaction (e.g., when the memory system fails to receive a command). For example, the memory system may perform the self-refresh operation in direct response to determining that the memory system has failed to receive the command. In some cases, the self-refresh operation may be performed in direct response to determining that the temperature of the memory system satisfies the threshold. In such cases, a period power-up procedure (e.g., self-refresh) may occur based on temperature. The self-refresh operation may improve data retention by reducing power consumption by the memory system and allowing the memory system to refresh without receiving commands from the host system.

At 235, the self-refresh operation (e.g., mode) may be exited. For example, the memory system may exit the self-refresh mode (e.g., stop performing the self-refresh operation) after performing the self-refresh operation. The memory system may exit the self-refresh mode in a variety of manners. For example, the memory system may receive, from the host system, a command to enter the second power mode based on receiving the power over the voltage rail. In some cases, the memory system may receive, from the host system, the command to enter the second power mode based on performing the self-refresh operation. In response to receiving the command, the memory system may receive the power over a second voltage rail. In such cases, the host system may initiate the memory system to exit the self-refresh mode. For example, the memory system may initiate the remaining portions of the memory system such that the entire memory system is initialized (e.g., turned on). In such cases, the memory system may receive a command, from the host system, to fully initialize the memory system. The memory system may enter the second power mode based on receiving the command.

At 235, the memory system may determine that the memory system has failed to receive additional power over the voltage rail during the time period that the memory system is operating in the first power mode. For example, the memory system may stop receiving power over the voltage rail. In such cases, the memory system may power off. For example, the initialized portion may power off.

At 235, the memory system may determine that the self-refresh operation is complete and that the power is being received over the voltage rail. The memory system may activate a second timer associated with the memory system in response to determining that the self-refresh operation is complete. The memory system may determine that the second duration indicated by the second timer expires in response to activating the second timer. The memory system may perform a second self-refresh operation after a second duration indicated by the second timer expires based on the power being received over the voltage rail. In such cases, the memory system may determine that the self-refresh operation is complete and perform a second self-refresh operation after a second timer expires.

Figure 3:
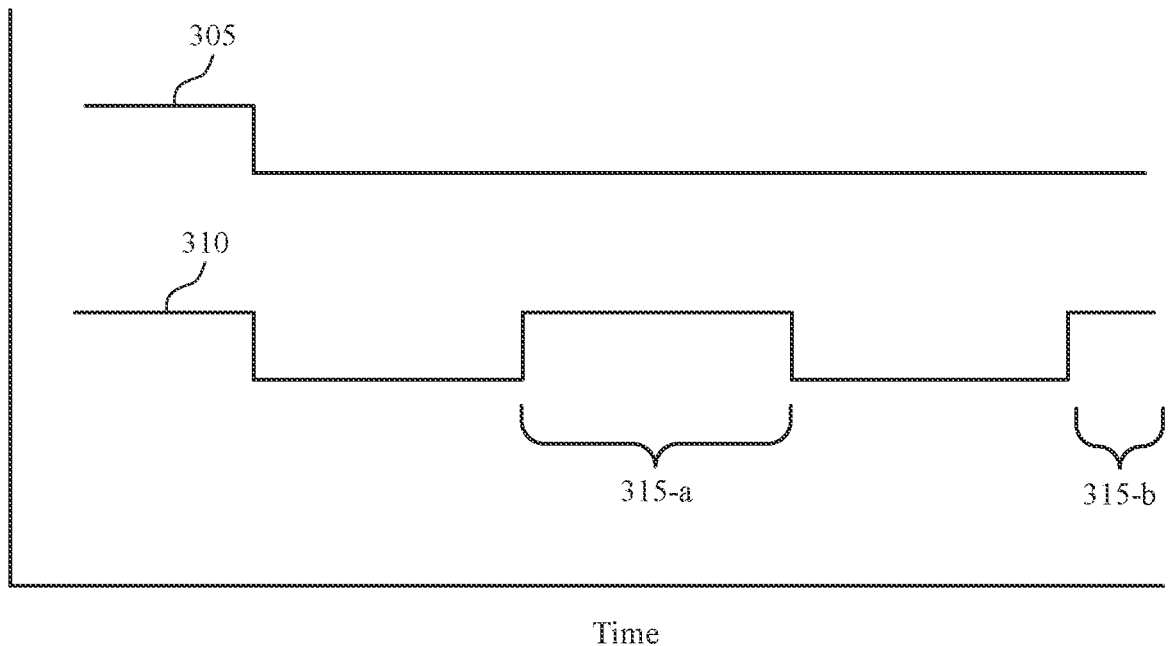
FIG. 3 illustrates an example of a timing diagram that supports techniques to refresh memory systems operating in low power states in accordance with examples as disclosed herein.

FIG. 3 illustrates an example of a timing diagram 300 that supports techniques to refresh memory systems operating in low power states in accordance with examples as disclosed herein. The timing diagram 300 may implement, or be implemented by, aspects of the system 100, flow diagram 200, or a combination thereof.

As described in further detail herein, the system may be configured to refresh memory systems operating in low power states. As such, timing diagram 300 may illustrate a relationship between a host system controller power supply (e.g., host system voltage rail) and a memory system power supply (e.g., memory system voltage rail). In this regard, the timing diagram 300 may include host power supply 305 and memory system power supply 310. The timing diagram 300 may also include self-refresh operations 315.

The voltage rail associated with the host system may be activated such that the host power supply 305 is on. In such cases, the host system may receive power over the host voltage rail. The voltage rail associated with the memory system may be activated such that the memory system power supply 310 is on. In such cases, the memory system may receive power over the memory system voltage rail. For example, the host power supply 305 and memory system power supply 310 may both be on (e.g., receiving power over the voltage rails).

The host power supply 305 may be deactivated after a duration of time. For example, the host voltage rail may be deactivated such that no power is supplied to the host system. The memory system power supply 310 may be deactivated after a duration of time. For example, the memory system voltage rail may be deactivated such that no power is supplied to the memory system. For example, the host power supply 305 and memory system power supply 310 may both be off (e.g., not receiving power over the voltage rails).

The memory system may start (e.g., activate a timer) such that if the memory system does not receive a command when the memory system voltage rail is deactivated, the memory system may perform the self-refresh operation 315-*a*. For example, the memory system may determine that the memory system fails to receive a command during the duration of time that the memory system voltage rail is deactivated. In such cases, the memory system may enter a self-refresh mode and perform the self-refresh operation 315-*a* without powering up the host controller and initialize the entire system. For example, the host power supply 305 may remain deactivated while the memory system performs the self-refresh operation 315-*a*. In such cases, the memory system may receive power over the memory system voltage rail such that the memory system power supply 310 is activated.

The memory system power supply 310 may be deactivated after self-refresh operation 315-*a* is complete. For example, the memory system voltage rail may be deactivated such that no power is supplied to the memory system after performing the self-refresh operation 315-*a*. The host power supply 305 may remain deactivated during the self-refresh operation 315-*a*.

The memory system may start (e.g., activate the timer) such that if the memory system does not receive a command when the memory system voltage rail is deactivated, the memory system may perform the self-refresh operation 315-*b*. For example, the memory system may determine that the memory system fails to receive a command during the duration of time that the memory system voltage rail is deactivated. In such cases, the memory system may enter the self-refresh mode and perform the self-refresh operation 315-*b* without powering up the host controller and initialize the entire system. For example, the host power supply 305 may remain deactivated while the memory system performs the self-refresh operation 315-*b*. In such cases, the memory system may receive power over the memory system voltage rail such that the memory system power supply 310 is activated.

In some cases, the timer may count a quantity of refresh cycles performed by the memory system. For example, the memory system may determine that the memory system performed self-refresh operation 315-*a*. In such cases, the memory system may determine that the second self-refresh operation 315-*b* may be performed in response to activating the timer and determining that memory system does not receive a command when the memory system voltage rail is deactivated. In some cases, the memory system may identify how frequent the memory system may perform the self-refresh operation 315.

In some systems, the host power supply 305 may be on to start a self-refresh operation 315. However, the functionality may be shifted to the memory system such that the memory system may initialize (e.g., turn on) a portion of the memory system and perform the self-refresh operation 315 without interaction from the host system. In such cases, the memory system may trigger the self-refresh operation 315 through power management of the memory system power supply 310, thereby reducing the power consumption and overall efficiency of the memory system without powering up the host system.

Figure 4:
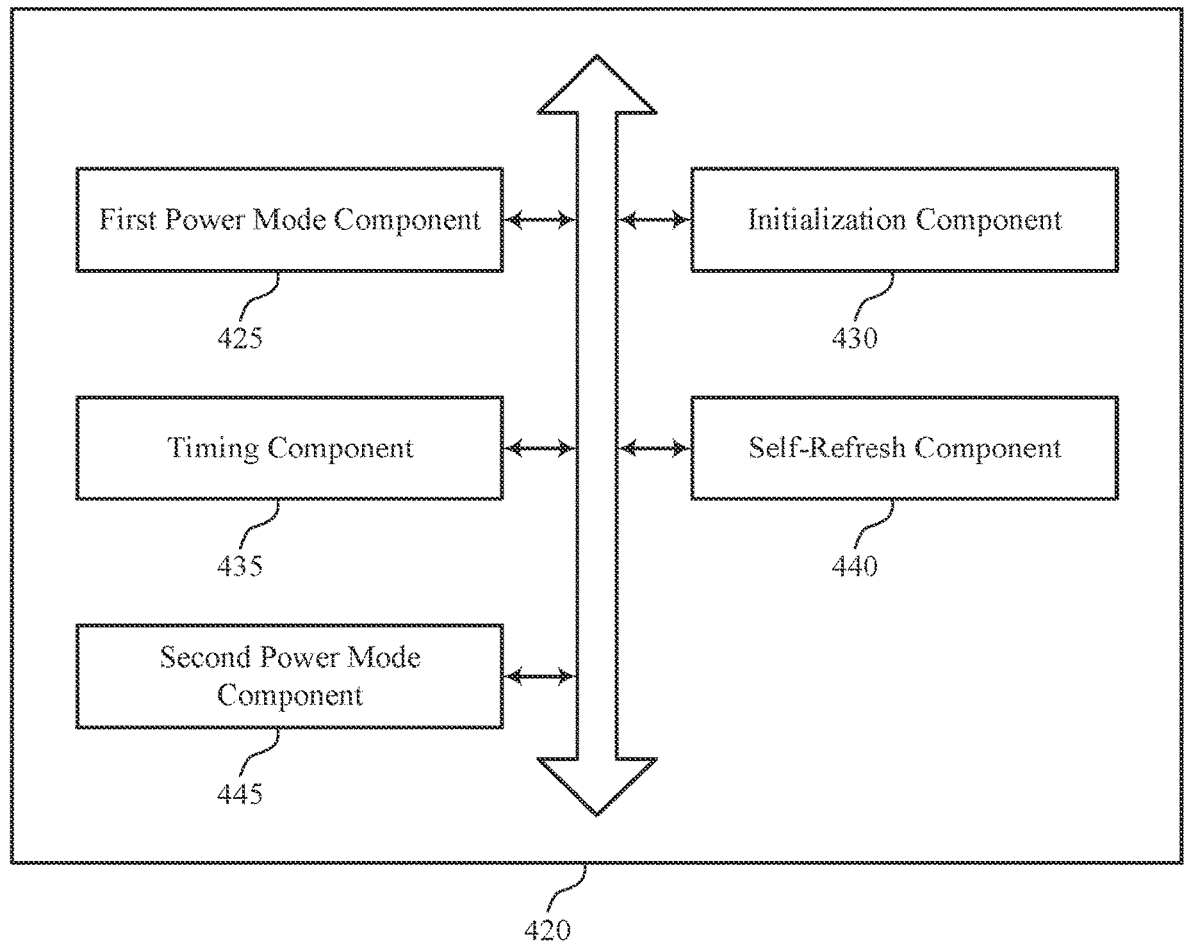
FIG. 4 shows a block diagram of a memory system that supports techniques to refresh memory systems operating in low power states in accordance with examples as disclosed herein.

FIG. 4 shows a block diagram 400 of a memory system 420 that supports techniques to refresh memory systems operating in low power states in accordance with examples as disclosed herein. The memory system 420 may be an example of aspects of a memory system as described with reference to FIGS. 1 through 3. The memory system 420, or various components thereof, may be an example of means for performing various aspects of techniques to refresh memory systems operating in low power states as described herein. For example, the memory system 420 may include a first power mode component 425, an initialization component 430, a timing component 435, a self-refresh component 440, a second power mode component 445, or any combination thereof. Each of these components may communicate, directly or indirectly, with one another (e.g., via one or more buses).

The first power mode component 425 may be configured as or otherwise support a means for operating a memory system in a first power mode that includes deactivation of a voltage rail that supplies power to the memory system. The initialization component 430 may be configured as or otherwise support a means for receiving, at the memory system, the power over the voltage rail during a time period that the memory system is operating in the first power mode. The timing component 435 may be configured as or otherwise support a means for determining that a duration indicated by a timer expires based at least in part on receiving the power over the voltage rail. The self-refresh component 440 may be configured as or otherwise support a means for performing a self-refresh operation based at least in part on determining that the duration indicated by the timer expires.

In some examples, the timing component 435 may be configured as or otherwise support a means for determining that the memory system has failed to receive a command over the duration based at least in part on determining that the duration indicated by the timer expires, where performing the self-refresh operation is based at least in part on determining that the memory system has failed to receive the command.

In some examples, the timing component 435 may be configured as or otherwise support a means for determining whether a temperature of the memory system satisfies a threshold based at least in part on determining that the duration indicated by the timer expires, where performing the self-refresh operation is based at least in part on determining that the temperature of the memory system satisfies the threshold.

In some examples, the timing component 435 may be configured as or otherwise support a means for activating the timer associated with the memory system for performing the self-refresh operation based at least in part on receiving the power over the voltage rail, where determining that the duration indicated by the timer expires is based at least in part on activating the timer.

In some examples, a second voltage rail of the memory system remains deactivated based at least in part on receiving the power over the voltage rail.

In some examples, the second power mode component 445 may be configured as or otherwise support a means for receiving, from a host system, a command to enter a second power mode based at least in part on receiving the power over the voltage rail. In some examples, the second power mode component 445 may be configured as or otherwise support a means for receiving, at the memory system, the power over a second voltage rail based at least in part on receiving the command.

In some examples, the first power mode component 425 may be configured as or otherwise support a means for determining that the memory system has failed to receive additional power over the voltage rail during the time period that the memory system is operating in the first power mode.

In some examples, the self-refresh component 440 may be configured as or otherwise support a means for determining that the self-refresh operation is complete and that the power is being received over the voltage rail. In some examples, the timing component 435 may be configured as or otherwise support a means for activating a second timer associated with the memory system based at least in part on determining that the self-refresh operation is complete. In some examples, the self-refresh component 440 may be configured as or otherwise support a means for performing a second self-refresh operation after a second duration indicated by the second timer expires based at least in part on the power being received over the voltage rail.

In some examples, the timing component 435 may be configured as or otherwise support a means for determining that the second duration indicated by the second timer expires based at least in part activating the second timer, where performing the second self-refresh operation is based at least in part on determining that the second duration indicated by the second timer expires.

Figure 5:
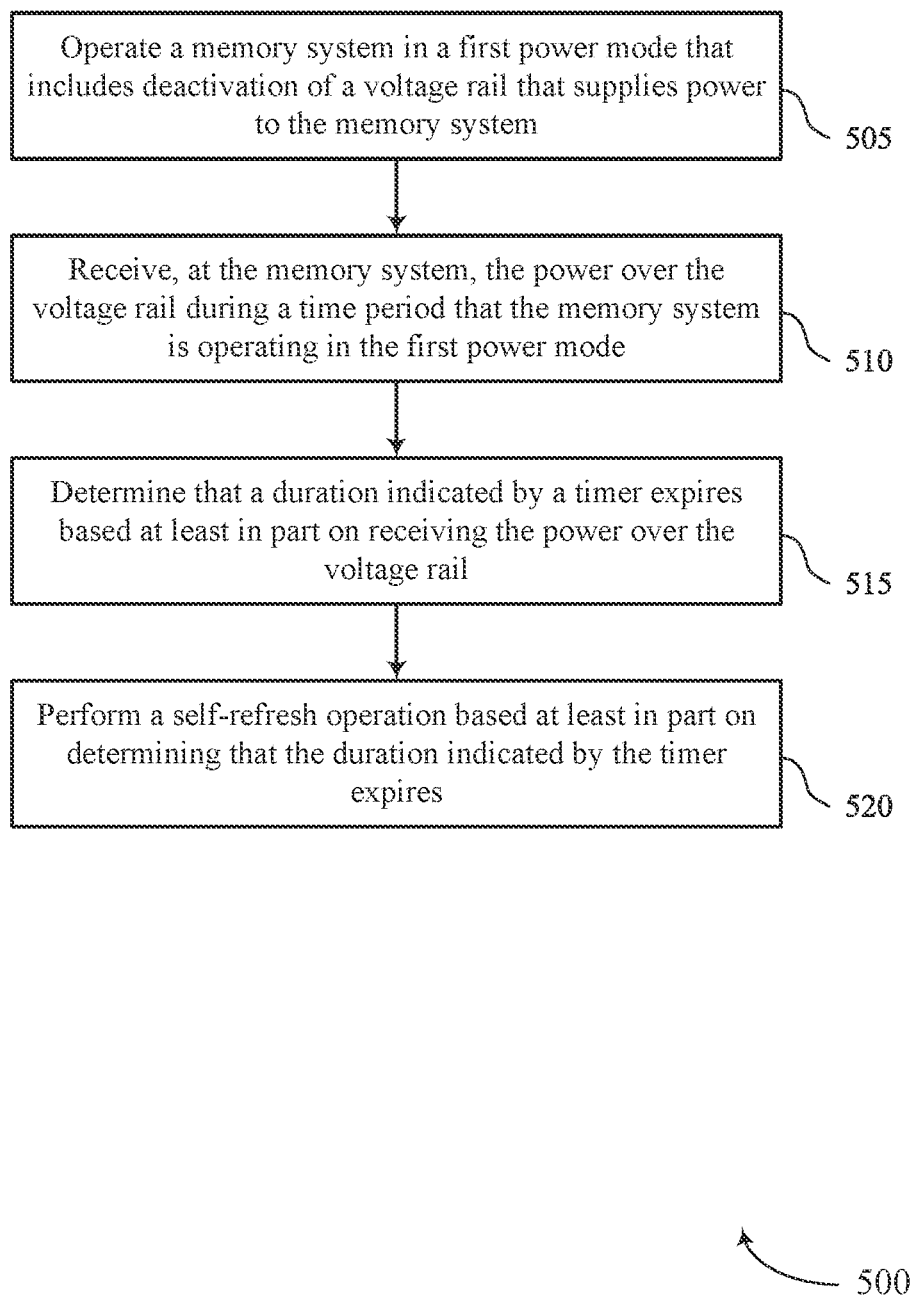
FIG. 5 shows a flowchart illustrating a method or methods that support techniques to refresh memory systems operating in low power states in accordance with examples as disclosed herein.

FIG. 5 shows a flowchart illustrating a method 500 that supports techniques to refresh memory systems operating in low power states in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally, or alternatively, the memory system may perform aspects of the described functions using special-purpose hardware.

At 505, the method may include operating a memory system in a first power mode that includes deactivation of a voltage rail that supplies power to the memory system. The operations of 505 may be performed in accordance with examples as disclosed herein. In some examples, aspects of the operations of 505 may be performed by a first power mode component 425 as described with reference to FIG. 4.

At 510, the method may include receiving, at the memory system, the power over the voltage rail during a time period that the memory system is operating in the first power mode. The operations of 510 may be performed in accordance with examples as disclosed herein. In some examples, aspects of the operations of 510 may be performed by an initialization component 430 as described with reference to FIG. 4.

At 515, the method may include determining that a duration indicated by a timer expires based at least in part on receiving the power over the voltage rail. The operations of 515 may be performed in accordance with examples as disclosed herein. In some examples, aspects of the operations of 515 may be performed by a timing component 435 as described with reference to FIG. 4.

At 520, the method may include performing a self-refresh operation based at least in part on determining that the duration indicated by the timer expires. The operations of 520 may be performed in accordance with examples as disclosed herein. In some examples, aspects of the operations of 520 may be performed by a self-refresh component 440 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for operating a memory system in a first power mode that includes deactivation of a voltage rail that supplies power to the memory system; receiving, at the memory system, the power over the voltage rail during a time period that the memory system is operating in the first power mode; determining that a duration indicated by a timer expires based at least in part on receiving the power over the voltage rail; and performing a self-refresh operation based at least in part on determining that the duration indicated by the timer expires.

Aspect 2: The method, apparatus, or non-transitory computer-readable medium of aspect 1, further including operations, features, circuitry, logic, means, or instructions, or any combination thereof for determining that the memory system has failed to receive a command over the duration based at least in part on determining that the duration indicated by the timer expires, where performing the self-refresh operation is based at least in part on determining that the memory system has failed to receive the command.

Aspect 3: The method, apparatus, or non-transitory computer-readable medium of any of aspects 1 through 2, further including operations, features, circuitry, logic, means, or instructions, or any combination thereof for determining whether a temperature of the memory system satisfies a threshold based at least in part on determining that the duration indicated by the timer expires, where performing the self-refresh operation is based at least in part on determining that the temperature of the memory system satisfies the threshold.

Aspect 4: The method, apparatus, or non-transitory computer-readable medium of any of aspects 1 through 3, further including operations, features, circuitry, logic, means, or instructions, or any combination thereof for activating the timer associated with the memory system for performing the self-refresh operation based at least in part on receiving the power over the voltage rail, where determining that the duration indicated by the timer expires is based at least in part on activating the timer.

Aspect 5: The method, apparatus, or non-transitory computer-readable medium of any of aspects 1 through 4 where a second voltage rail of the memory system remains deactivated based at least in part on receiving the power over the voltage rail.

Aspect 6: The method, apparatus, or non-transitory computer-readable medium of any of aspects 1 through 5, further including operations, features, circuitry, logic, means, or instructions, or any combination thereof for receiving, from a host system, a command to enter a second power mode based at least in part on receiving the power over the voltage rail and receiving, at the memory system, the power over a second voltage rail based at least in part on receiving the command.

Aspect 7: The method, apparatus, or non-transitory computer-readable medium of any of aspects 1 through 6, further including operations, features, circuitry, logic, means, or instructions, or any combination thereof for determining that the memory system has failed to receive additional power over the voltage rail during the time period that the memory system is operating in the first power mode.

Aspect 8: The method, apparatus, or non-transitory computer-readable medium of any of aspects 1 through 7, further including operations, features, circuitry, logic, means, or instructions, or any combination thereof for determining that the self-refresh operation is complete and that the power is being received over the voltage rail; activating a second timer associated with the memory system based at least in part on determining that the self-refresh operation is complete; and performing a second self-refresh operation after a second duration indicated by the second timer expires based at least in part on the power being received over the voltage rail.

Aspect 9: The method, apparatus, or non-transitory computer-readable medium of aspect 8, further including operations, features, circuitry, logic, means, or instructions, or any combination thereof for determining that the second duration indicated by the second timer expires based at least in part activating the second timer, where performing the second self-refresh operation is based at least in part on determining that the second duration indicated by the second timer expires.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   operating a memory system in a first power mode that includes deactivation of a voltage rail that supplies power to the memory system;
   receiving, at the memory system, the power over the voltage rail during a time period that the memory system is operating in the first power mode, wherein a second voltage rail of the memory system remains deactivated during a time period that the memory system is receiving the power over the voltage rail;
   determining that a duration indicated by a timer expires based at least in part on receiving the power over the voltage rail; and
   performing a self-refresh operation based at least in part on determining that the duration indicated by the timer expires.

2. The method of claim 1, further comprising:
   determining that the memory system has failed to receive a command over the duration based at least in part on determining that the duration indicated by the timer expires, wherein performing the self-refresh operation is based at least in part on determining that the memory system has failed to receive the command.

3. The method of claim 1, further comprising:
   determining whether a temperature of the memory system satisfies a threshold after determining that the duration indicated by the timer expires, wherein performing the self-refresh operation is based at least in part on determining that the temperature of the memory system satisfies the threshold.

4. The method of claim 1, further comprising:
   activating the timer associated with the memory system for performing the self-refresh operation based at least in part on receiving the power over the voltage rail, wherein determining that the duration indicated by the timer expires is based at least in part on activating the timer.

5. The method of claim 1, further comprising:
   receiving, from a host system, a command to enter a second power mode based at least in part on receiving the power over the voltage rail; and
   receiving, at the memory system, the power over the second voltage rail based at least in part on receiving the command.

6. The method of claim 1, further comprising:
   determining that the memory system has failed to receive additional power over the voltage rail during the time period that the memory system is operating in the first power mode.

7. The method of claim 1, further comprising:
   determining that the self-refresh operation is complete and that the power is being received over the voltage rail;
   activating a second timer associated with the memory system based at least in part on determining that the self-refresh operation is complete; and
   performing a second self-refresh operation after a second duration indicated by the second timer expires based at least in part on the power being received over the voltage rail.

8. The method of claim 7, further comprising:
   determining that the second duration indicated by the second timer expires based at least in part activating the second timer, wherein performing the second self-refresh operation is based at least in part on determining that the second duration indicated by the second timer expires.

9. An apparatus, comprising:
   a memory device; and
   a controller coupled with the memory device and configured to cause the apparatus to:
   operate a memory system in a first power mode that includes deactivation of a voltage rail that supplies power to the memory system;

receive, at the memory system, the power over the voltage rail during a time period that the memory system is operating in the first power mode, wherein a second voltage rail of the memory system remains deactivated during a time period that the memory system is receiving the power over the voltage rail;

determine that a duration indicated by a timer expires based at least in part on receiving the power over the voltage rail; and perform a self-refresh operation based at least in part on determining that the duration indicated by the timer expires.

10. The apparatus of claim 9, wherein the controller is further configured to cause the apparatus to:

determine that the memory system has failed to receive a command over the duration based at least in part on determining that the duration indicated by the timer expires, wherein performing the self-refresh operation is based at least in part on determining that the memory system has failed to receive the command.

11. The apparatus of claim 9, wherein the controller is further configured to cause the apparatus to:

determine whether a temperature of the memory system satisfies a threshold after determining that the duration indicated by the timer expires, wherein performing the self-refresh operation is based at least in part on determining that the temperature of the memory system satisfies the threshold.

12. The apparatus of claim 9, wherein the controller is further configured to cause the apparatus to:

activate the timer associated with the memory system for performing the self-refresh operation based at least in part on receiving the power over the voltage rail, wherein determining that the duration indicated by the timer expires is based at least in part on activating the timer.

13. The apparatus of claim 9, wherein the controller is further configured to cause the apparatus to:

receive, from a host system, a command to enter a second power mode based at least in part on receiving the power over the voltage rail; and receive, at the memory system, the power over the second voltage rail based at least in part on receiving the command.

14. The apparatus of claim 9, wherein the controller is further configured to cause the apparatus to:

determine that the memory system has failed to receive additional power over the voltage rail during the time period that the memory system is operating in the first power mode.

15. The apparatus of claim 9, wherein the controller is further configured to cause the apparatus to:

determine that the self-refresh operation is complete and that the power is being received over the voltage rail;

activate a second timer associated with the memory system based at least in part on determining that the self-refresh operation is complete; and perform a second self-refresh operation after a second duration indicated by the second timer expires based at least in part on the power being received over the voltage rail.

16. The apparatus of claim 15, wherein the controller is further configured to cause the apparatus to:

determine that the second duration indicated by the second timer expires based at least in part activating the second timer, wherein performing the second self-refresh operation is based at least in part on determining that the second duration indicated by the second timer expires.

17. A non-transitory computer-readable medium storing code comprising instructions which, when executed by a processor of an electronic device, cause the electronic device to:

operate a memory system in a first power mode that includes deactivation of a voltage rail that supplies power to the memory system;

receive, at the memory system, the power over the voltage rail during a time period that the memory system is operating in the first power mode, wherein a second voltage rail of the memory system remains deactivated during a time period that the memory system is receiving the power over the voltage rail;

determine that a duration indicated by a timer expires based at least in part on receiving the power over the voltage rail; and perform a self-refresh operation based at least in part on determining that the duration indicated by the timer expires.

18. The non-transitory computer-readable medium of claim 17, wherein the instructions, when executed by the processor of the electronic device, further cause the electronic device to:

determine that the memory system has failed to receive a command over the duration based at least in part on determining that the duration indicated by the timer expires, wherein performing the self-refresh operation is based at least in part on determining that the memory system has failed to receive the command.

19. The non-transitory computer-readable medium of claim 17, wherein the instructions, when executed by the processor of the electronic device, further cause the electronic device to:

determine whether a temperature of the memory system satisfies a threshold after determining that the duration indicated by the timer expires, wherein performing the self-refresh operation is based at least in part on determining that the temperature of the memory system satisfies the threshold.

20. The non-transitory computer-readable medium of claim 17, wherein the instructions, when executed by the processor of the electronic device, further cause the electronic device to:

activate the timer associated with the memory system for performing the self-refresh operation based at least in part on receiving the power over the voltage rail, wherein determining that the duration indicated by the timer expires is based at least in part on activating the timer.

21. The non-transitory computer-readable medium of claim 17, wherein the instructions, when executed by the processor of the electronic device, further cause the electronic device to:

receive, from a host system, a command to enter a second power mode based at least in part on receiving the power over the voltage rail; and receive, at the memory system, the power over the second voltage rail based at least in part on receiving the command.

22. The non-transitory computer-readable medium of claim 17, wherein the instructions, when executed by the processor of the electronic device, further cause the electronic device to:

determine that the memory system has failed to receive additional power over the voltage rail during the time period that the memory system is operating in the first power mode.

* * * * *